United States Patent [19]

Stimson

[11] Patent Number: 5,629,653
[45] Date of Patent: May 13, 1997

[54] RF MATCH DETECTOR CIRCUIT WITH DUAL DIRECTIONAL COUPLER

[75] Inventor: Bradley O. Stimson, Mountain View, Calif.

[73] Assignee: Applied Materials, Inc., Santa Clara, Calif.

[21] Appl. No.: 499,697

[22] Filed: Jul. 7, 1995

[51] Int. Cl.$^6$ .................................................. H03H 7/40
[52] U.S. Cl. .................................. 333/17.3; 333/99 PL
[58] Field of Search ................................ 333/17.3, 175, 333/99 PL

[56] References Cited

U.S. PATENT DOCUMENTS

| | | | |
|---|---|---|---|
| 4,015,223 | 3/1977 | Cheze | 333/17.3 |
| 4,375,051 | 2/1983 | Theall | 333/17.3 |
| 4,493,112 | 1/1985 | Bruene | 333/17.3 X |
| 4,621,242 | 11/1986 | Theall, Jr. et al. | 333/17.3 |
| 4,951,009 | 8/1990 | Collins | 333/17.3 |
| 4,977,301 | 12/1990 | Maehara et al. | |
| 5,065,118 | 11/1991 | Collins et al. | 333/33 |
| 5,079,507 | 1/1992 | Ishida et al. | 324/645 |
| 5,187,454 | 2/1993 | Collins et al. | 333/17.3 |
| 5,187,457 | 2/1993 | Chawla et al. | 333/175 X |

*Primary Examiner*—Paul Gensler
*Attorney, Agent, or Firm*—Fish & Richardson, P.C.

[57] ABSTRACT

A detector circuit for controlling an RF match circuit that receives an RF power signal from an RF source and delivers the RF power signal to a load. The RF match circuit includes a first variable reactance element which is controlled by a first control signal and a second variable reactance element is controlled by a second control signal. The detector circuit includes a dual directional coupler which generates a forward signal that is proportional to RF power delivered to the match circuit and a reflected signal that is proportional to RF power reflected back from the RF match circuit. The detector also includes a first branch circuit receiving the reflected signal and producing a first and second output signal therefrom and a second branch circuit receiving the forward signal and producing a first and second output signal therefrom. The detector further includes a first phase detector receiving the first output signals of the first and second branch circuits and generating a first phase detection output signal from which the first control signal is derived; and a second phase detector receiving the second output signals of the first and second branch circuits and generating a second phase detection output signal from which the second control signal is derived.

29 Claims, 9 Drawing Sheets

— Smith Chart
—+— Zin vs C2 with C1 max.
—◇— Zin vs C2 with C1 min.
—□— Zin vs C2 with C1 at match value

FIG. 8

— Smith Chart
+ Zin vs C1 with C2 max.
◇ Zin vs C1 with C2 min.
□ Zin vs C1 with C2 at mid value

RF MATCH DETECTOR CIRCUIT WITH DUAL DIRECTIONAL COUPLER

BACKGROUND OF THE INVENTION

The invention relates to a RF match detector circuit for automatic control of an RF match circuit connected between a power source and a load, such as a plasma in a plasma processing chamber.

In RF plasma processing systems, RF power is typically coupled into the plasma that is present in the chamber through a match circuit which contains variable reactance elements. The purpose of the match circuit is to transform the impedance of the load (i.e., the plasma) to a value that equals or matches the characteristic impedance of the line through which the RF power is delivered to the chamber. At the match point, optimum power is delivered into the plasma and little power is reflected back toward the RF supply. Tuning to the match point is accomplished by appropriately varying the variable reactance elements within the match circuit. Obviously, it is desirable to keep the system tuned to the match point during plasma processing.

Unfortunately, the impedance of the plasma is a complex and highly variable function of many process parameters and conditions. In other words, the impedance of the plasma will typically vary significantly throughout a process run and from one chamber to the next. Thus, to maintain the match circuit at the match point requires constant tuning of the variable reactance circuit components.

Self-tuning circuits are available to perform the required tuning automatically. Unfortunately, many such circuits are not as stable, they do not react to changes in process conditions (i.e., changes in plasma impedance) as rapidly, and they are not as accurate as users (e.g. semiconductor fabrication companies) might wish them to be.

SUMMARY OF THE INVENTION

In general, in one aspects the invention is a detector circuit for controlling an RF match circuit that receives an RF power signal from an RF source and delivers RF power signal to a load. The RF match circuit which is controlled by the detector circuit includes first and second variable reactance elements in which reactance is controlled by first and second control signals, respectively. The detector circuit includes a dual directional coupler connected between the RF source and the RF match circuit and generating a forward signal and a reflected signal. The forward signal is proportional to RF power delivered to the match circuit and the reflected signal is proportional to RF power reflected back from the RF match circuit. The detector circuit also includes a first branch circuit which receives the reflected signal and produces a first and second output signal therefrom; a second branch circuit which receives the forward signal and producing a first and second output signal therefrom; a first phase detector receiving the first output signals of the first and second branch circuits and generating a first phase detection output signal from which the first control signal is derived; and a second phase detector receiving the second output signals of the first and second branch circuits and generating a second phase detection output signal from which the second control signal is derived.

Preferred embodiments include the following features. The first and second branch circuits include first and second power splitters, respectively. The first power splitter receives a signal derived from the reflected signal and generates first and second output signals therefrom. Similarly, the second power splitter receives a signal derived from the forward signal and also generates first and second output signals therefrom. The first output signal of the first branch circuit is a phase shifted version of the second output signal of the first branch circuit. Similarly, the first output signal of the second branch circuit is a phase shifted version of the second output signal of the second branch circuit. The phase shifts are introduced by corresponding phase shift elements in the first and second branch circuits.

Also in preferred embodiments, the first and second branch circuits include a first low pass filter and a second low pass filter, respectively. There is also a harmonic termination filter connected to the output of the dual directional coupler, which is designed to terminate $2^{nd}$, $3^{rd}$, and higher harmonics.

In general, in another aspect, the invention is an RF matching circuit for matching an RF power source to a load. The RF matching circuit includes an RF match section connected to the load; and a detector circuit connected between the RF source and the RF match section. The RF match section includes a first variable reactance element; a second variable reactance element; a first control circuit controlling the reactance of the first variable reactance element in response to a first control signal; and a second control circuit controlling the reactance of the second variable reactance element in response to a second control signal. The detector circuit includes, as previously described, a dual directional coupler, first and second branch circuits, and first and second phase shifters.

In preferred embodiments, the first and second variable reactance elements are variable capacitors with movable blades that control the capacitance thereof. In addition, the first and second control circuits include motors that in response to control signals from the detector circuit moves the blades of the variable capacitors to vary the capacitance thereof.

In general, in yet another aspect, the invention is a plasma processing system including a plasma chamber, and an RF matching circuit for matching an RF power source to the plasma chamber. The RF matching circuit includes an RF match section connected to the plasma chamber; and a detector circuit connected between said RF power source and said RF match section. Both the RF match section and the detector circuit are as described above.

The invention achieves and maintains a lock condition from almost any extreme operating condition. In other words, it has nearly a 100% acquisition range. Moreover, it acquires the lock condition rapidly and accurately.

Other advantages and features will become apparent from the following description of the preferred embodiment and from the claims.

DESCRIPTION OF THE PREFERRED EMBODIMENTS

Figure 1:
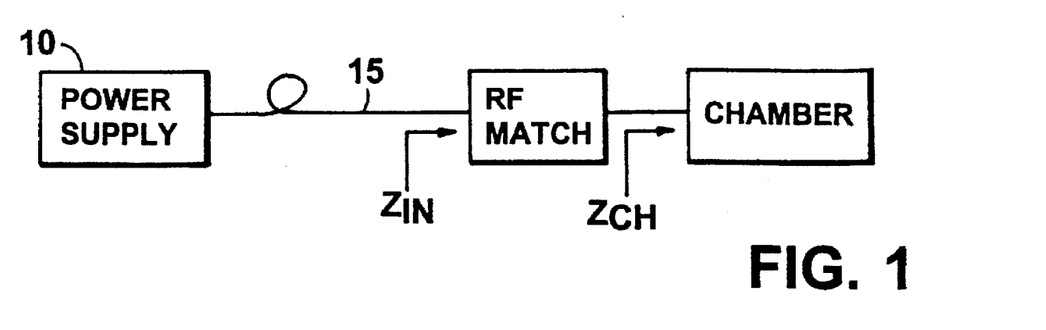
FIG. 1 is a block diagram of a plasma processing system which includes a detector circuit and a RF match section.
Figure 2:
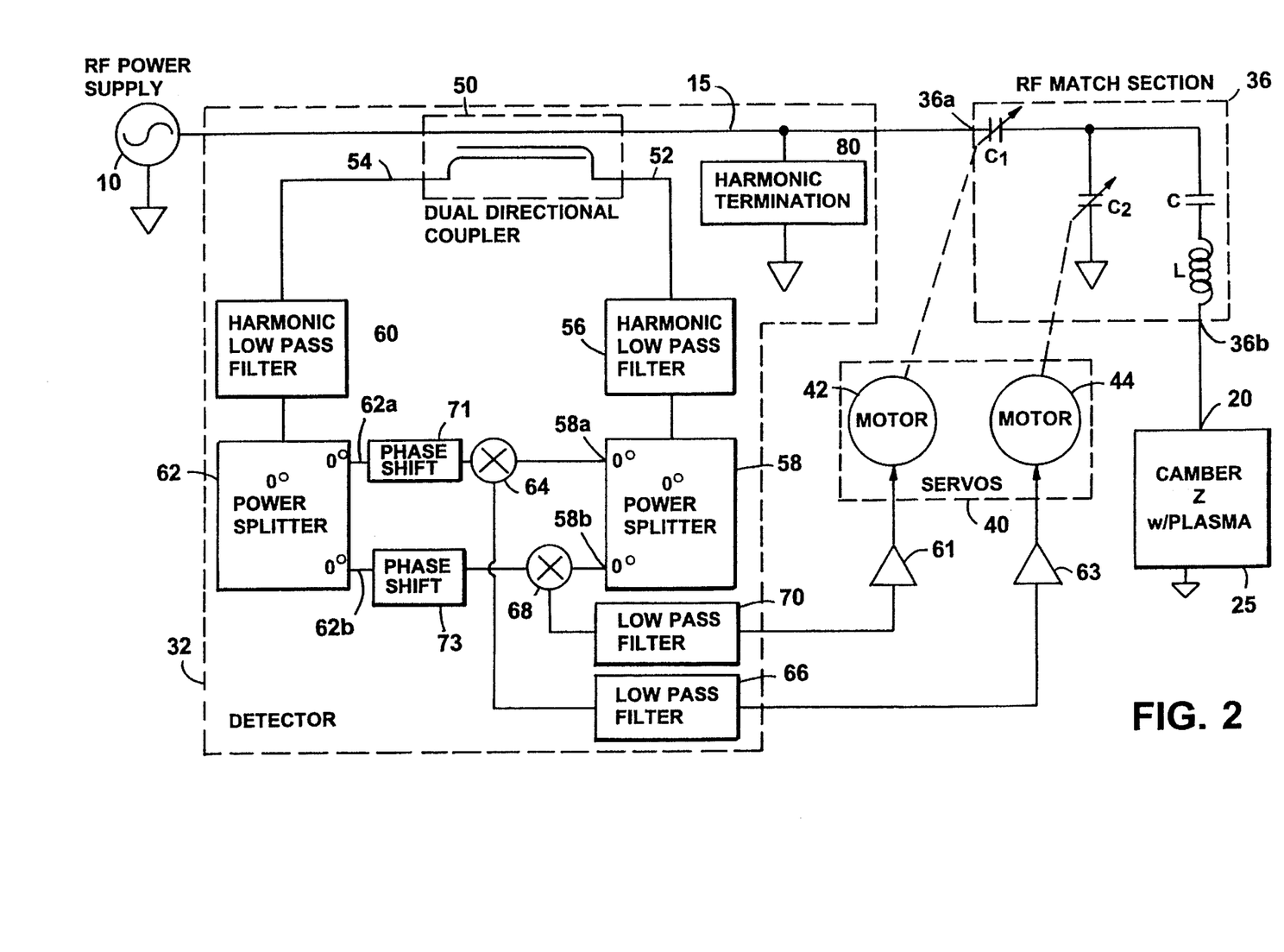
FIG. 2 shows a block diagram of the detector circuit and the RF match section.

Referring to FIGS. 1 and 2, an RF power source 10 supplies RF power through a coaxial cable 15 to an input 20 of a plasma chamber 25. Cable 15 is coupled to input 20 of chamber 25 through an RF match section 36, which is mounted on or near chamber 25. RF match section 36 has a power input 36a connected to the RF power source 10 via the cable 15 and a power output 36b connected to the plasma chamber RF input 20. In the described embodiment, power is delivered into plasma chamber 25 by means of some reactive element, e.g. a coil antenna. The input impedance of chamber 25 is $Z_{CH}$ and the transformed impedance (i.e., the input impedance of RF match section 36) is $Z_{IN}$. RF match section 36 transforms $Z_{CH}$ to produce a $Z_{IN}$ having a value that matches the characteristic impedance of cable 15 so as to optimize the transfer of power from generator 10 into the plasma within chamber 20.

RF power source 10 is a conventional RF generator having an output impedance of 50 ohms. The characteristic impedance of the coaxial cable 15 is also 50 ohms.

In a simplified form, used for purposes of this description, RF match section 36 includes a variable capacitor $C_1$ connected in series through an input capacitor C and an input inductor L with RF input 20. It also includes a second variable capacitor $C_2$ which is connected across the capacitor $C_1$ and ground. Both capacitors $C_1$ and $C_2$ include movable capacitance plates the orientation of which are controlled by motors 42 and 44 of a servo unit 40.

An RF detector circuit 32, coupled to coaxial cable 15 through a dual directional coupler 50, monitors the forward and reverse power on coaxial line 15 and generates therefrom two signals which control the operation of motors 40 and 42, and thereby the values of the variable capacitors $C_1$ and $C_2$, respectively. Dual directional coupler 50 is typically located close to the RF match section.

Within detector circuit 32, dual directional coupler 50 has a forward signal output line 52 and a reverse signal output line 54. Forward signal output line 52 yields a signal that is proportional to but significantly lower in magnitude than the forward voltage signal on line 15. Similarly, reverse signal output line 54 yields a signal that is proportional to the reflected voltage signal on line 15. Thus, directional coupler 50 makes it possible to easily determine the reflection coefficient, $\Gamma$ (i.e., the ratio of reflected signal to forward signal), of the combination of the RF match section and the plasma chamber and to thereby determine where in the $\Gamma$-plane the system is operating.

Dual directional coupler 50 is a standard, commercially available component. For a description of the design and operation of dual directional couplers in general, see standard textbooks, e.g. *Single-Sideband Systems and Circuit*, Ed. William E. Sabin and Edgar O. Schoenke, McGraw-Hill Book Company, pages 425-435. In the described embodiment, dual directional coupler 50 is a 50 db directional coupler, meaning that the output on the forward and reverse signal output lines are 50 db down from the signal that is passing through on the main line. This ensures that its presence on the line will not affect the through signal on the control loop and it ensures that the voltage levels are well below that of the main line and at a level that can be processed by the detector circuit.

Between dual directional coupler 50 and RF match section 36, there is a harmonic termination filter 80. Because the plasma is nonlinear, it produces harmonics which can pass through the match section and reflect off of the power supply to set up standing waves on the line. Harmonic termination filter 80 terminates the $2^{nd}$, $3^{rd}$ and some of the $4^{th}$ harmonics, i.e., it terminates the harmonics which contain most of the energy outside of the fundamental frequency.

Since the actual impedance seen by the harmonics depends on the cable length, it may be desirable to use a fixed cable length from one system to the next so as to reduce the possibility that the different systems of a given design will behave differently. Of course, if the power supply has a harmonic terminator, cable length will not be an issue.

The signal on forward output line 52 of dual directional coupler 50 passes first through a harmonic low pass filter 56 and then into a 0° power splitter 58, which has two outputs 58a and 58b. The signal on the reverse output line 54 passes through another harmonic low pass filter 60 and then into a second power splitter 62, which has two outputs 62a and 62b. Harmonic low pass filters 56 and 60 prevent the unwanted harmonics from getting into the detector circuit and assures that the phase detectors will be responding to the signal at the fundamental frequency only. In the described embodiment, in which the RF frequency is 60 MHZ, harmonic low pass filters 56 and 60 are each designed to have a cut-off frequency of about 65 MHZ. They are commercially available, off-the-shelf components.

Each power splitter 58 and 62 receives its input signal and generates therefrom two identical signals of equal power. They too are commercially available items. For a description of the design and operation of power splitters see standard textbooks, e.g. *Single-Sideband Systems and Circuit*, Ed. William E. Sabin and Edgar O. Schoenke, McGraw-Hill Book Company, pages 435-447.

The signal on output line 62a is phase shifted by a phase shifting element 71. Similarly, the signal on output line 62b is phase shifted by a phase shifting element 73.

Note that the description herein assumes that the phase shift from the outputs of directional coupler 50 to the inputs of the two power splitters 58 and 62 are identical. In addition, it also assumes that the phase shift from the outputs of directional coupler 50 to each of the outputs of power splitters 58 and 62 are also identical (assuming that 0° power splitters are used). These assumptions however are not requirements of the system. If the assumptions are not true, then the values of the phase shifting elements 71 and 73 simply need to be adjusted to account for any differences.

After the two power splitters 58 and 62, there are two phase detectors 64 and 68, each of which has two input lines. The two input lines of phase detector 64 receive one of the output signals from power splitter 58 and the phase shifted output signal from power splitter 62. The two input lines of phase detector 68 receive the other output signal from power splitter 58 and the shifted output signal from power splitter 62. Phase detectors 64 and 68 each generate an output signal that is a measure of the phase difference between its two input signals.

Figure 3:
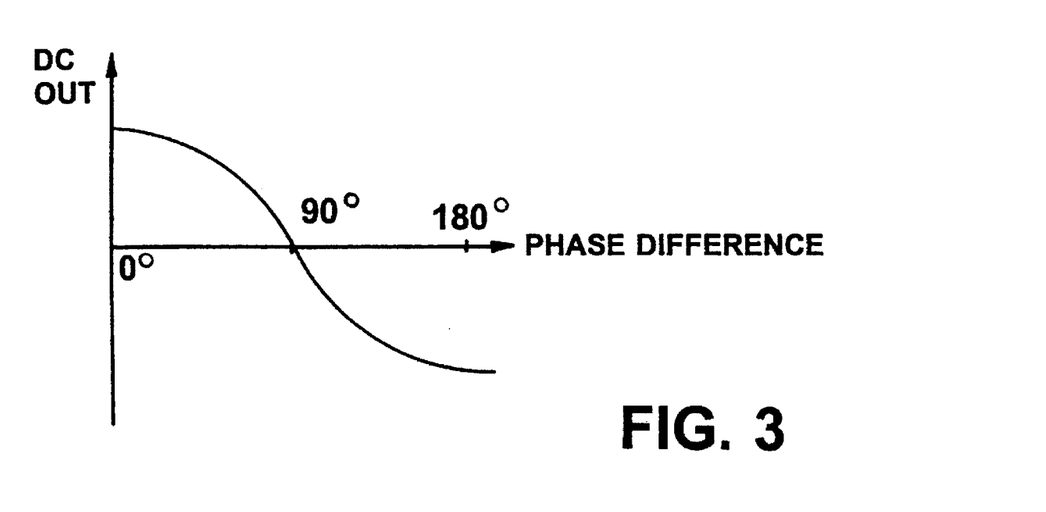
FIG. 3 shows the transfer characteristics of the phase detectors.

The transfer characteristics of phase detectors are shown in FIG. 3. When the two input signals are exactly 90° out of phase the output of the phase detector is zero. A positive output voltage indicates that input signal on one input line is less than 90° out of phase with the input signal on the other input line; whereas a negative output voltage indicates that the opposite is true, i.e., the one input signal is greater than 90° out of phase with the other input signal.

The output of phase detector 64, after passing through a low pass filter 66, controls motor 44 and thereby the value of capacitor $C_2$. Similarly, the output of the other phase detector 68, after passing through another low pass filter 70, controls motor 42 and thereby the value of capacitor $C_1$. Low pass filters 66 and 68 are simple DC low pass filters, e.g. capacitors (see FIG. 11 for details on construction).

In the described embodiment, motors 42 and 44 are DC motors, although with appropriate modifications in the circuitry, other motors (e.g. stepping motors) could also be used. In addition, drivers 61 and 63 may optionally be used between low pass filters 70 and 66 and motors 42 and 44.

As will become apparent form the discussion below, the detector circuit simultaneously adjusts both capacitors $C_1$ and $C_2$ so that the system moves towards the match condition. However, as the capacitors of the match section are being changed, the power to the chamber will also change and this will, in turn, change plasma impedance and the match point. The changes in the location of the match point will necessitate further adjustments of the RF match section to reach the match point. Detector circuit 32 automatically makes the required adjustments to reach and remain at the match point. Moreover, detector circuit 32 will continue to make the required changes in $C_1$ and $C_2$ to keep the system at the match point even as the plasma impedance changes during processing.

Smith Charts

Figure 4:
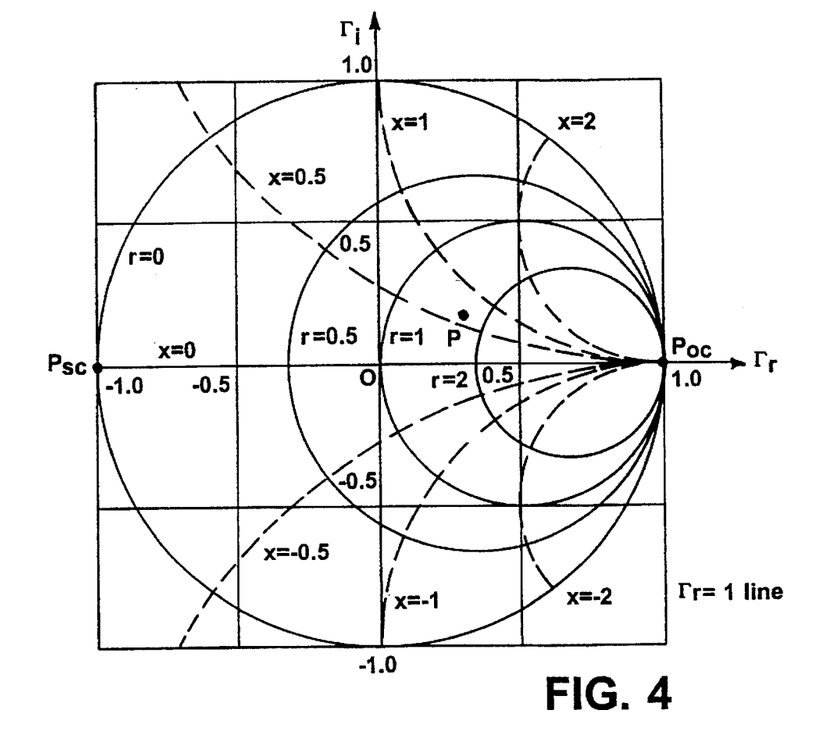
FIG. 4 is an example of a Smith Chart graph.

To understand how the above circuit operates, it is useful to first review Smith Charts. The Smith chart is a convenient tool widely used by persons skilled in the art to analyze RF circuits. Briefly, the Smith Chart is a graphical plot of normalized resistance and reactance functions in the reflection coefficient plane (i.e., the Γ-plane). The reflection coefficient, Γ, is defined as the ratio of the complex amplitudes of the reflected voltage and incident voltage at a load $Z_L$ that terminates a loss-less transmission line having a characteristic impedance of $Z_O$. Mathematically, it is expressed as follows:

$$\Gamma = \frac{Z_L - Z_O}{Z_L + Z_O} = |\Gamma|e^{j\Theta_\Gamma} = \Gamma_r + j\Gamma_i.$$

where $j=(-1)^{1/2}$. The Smith chart, an example of which is shown in FIG. 4, is a plot in Γ-space, with the horizontal axis representing $\Gamma_r$ and the vertical axis representing $\Gamma_i$. Another useful quantity, which is referred to as normalized load $Z_L/Z_O$, is equal to:

$$z_L = \frac{Z_L}{Z_O} = r + jx.$$

Different values of r when plotted in the Smith chart appear as a family of circles of different radii with their centers located along the $\Gamma_r$ axis and all passing through Γ=1.0∠0°. Different values of x when plotted in the Smith chart appear as another family of circles of different radii with their centers located along the $\Gamma_r$=1 line and all passing through the point Γ=1.0∠0°. Thus, the Smith chart makes it very easy to map load impedance into reflection coefficient and vice versa.

The reflection coefficient can also be expressed in terms of the forward and reflected voltage as follows:

$$\bar{\Gamma} = \frac{\bar{V}_{ref}}{\bar{V}_{for}} = \frac{|\bar{V}_{ref}|}{|\bar{V}_{for}|} e^{j\Theta}$$

where $\Theta = \angle \text{ref} - \angle \text{for}$.

Note that there is also an admittance Smith Chart. It looks just like the impedance Smith chart except that the constant conductance circles all pass through $\Gamma_r + j\Gamma_i = -1$. That is, it is the mirror image of the impedance Smith Chart.

Operation of the Detector Circuit

The combination of the dual directional coupler 50, phase shift element 71 and phase detector 64 divides the β-plane in half by a control line (or discriminator line) passing through $Z_O$. Similarly, the combination of the dual directional coupler 50, phase shift element 73 and phase detector 68 divides the Γ-plane in half by another control line passing through $Z_O$, i.e., the center of the Smith Chart. The amount of phase introduced by the phase shift element 71 or 73 determines the orientations of these control lines. The polarity of the output of phase detector 64 or 68 identifies on which side of its associated control line that the operating point lies.

Figure 7:
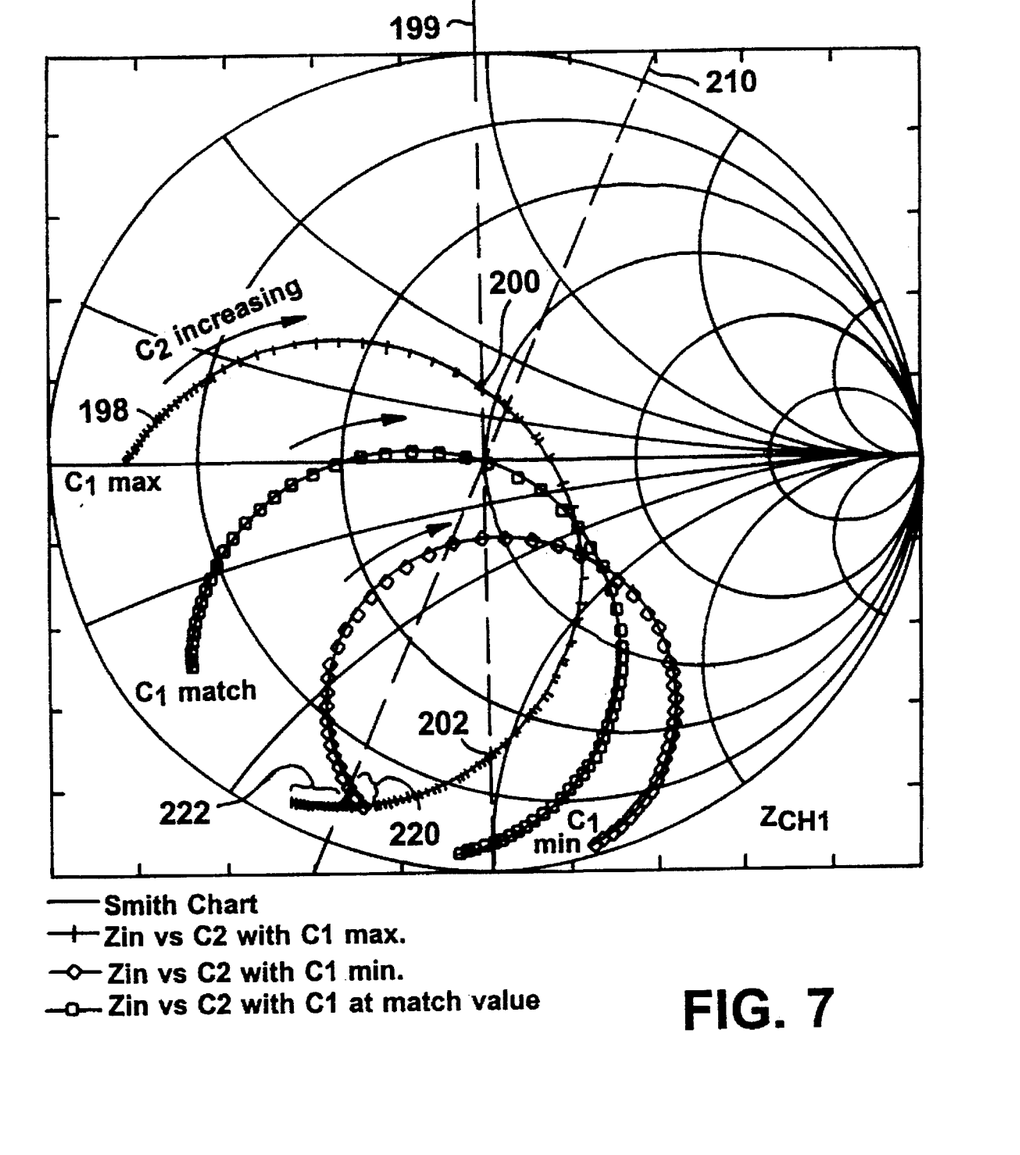
FIG. 7 shows a plot of RF match input reflection coefficient as a function of $C_2$ for a chamber impedance of $Z_{CH1}$ and for three different values of $C_1$, namely, $C_{1min}$, $C_{1match}$, and $C_{1max}$.

More specifically, if it is assumed for example, that phase shift element 71 introduces a 0° phase shift, then the control line which divides the Γ-plane is the vertical axis (i.e., oriented at 90°) and it passes through $Z_O$, as shown by control line 199 in FIG. 7. The polarity of the output signal produced by phase detector 64 identifies on which side of that vertical control line the operating point (i.e., $Z_{IN}$, input impedance) lies. If the output of phase detector 64 is positive, the operating point lies to the left of the control line. If the output is negative, the operating point lies to the right of the control line. And, if the output is zero, the operating point lies on the control line.

Introducing phase shift through phase shift element 71 or 73 simply rotates the control line by an amount equal to the phase shift. For example, if the phase shift element is 330°, control line will be oriented as shown by control line 210 in FIG. 7. Also note that this same control line orientation can be achieved by introducing a phase shift of 30° into the output line from power splitter 58 and introducing 0° phase shift into the output line of power splitter 62. In other words, by phase shifting the reflected signal relative to the forward signal (or vice versa), you can cause the control line to rotate to any desired orientation.

As will now be explained, the values of the phase shift elements are selected to provide the best discrimination for the detector circuit and the smallest region of instability.

First, we briefly explain the contributions that each of the elements within the RF match section of FIG. 2 makes to $Z_{in}$, the transformed input impedance as seen by the coaxial line supplying power to the chamber.

Figure 5:
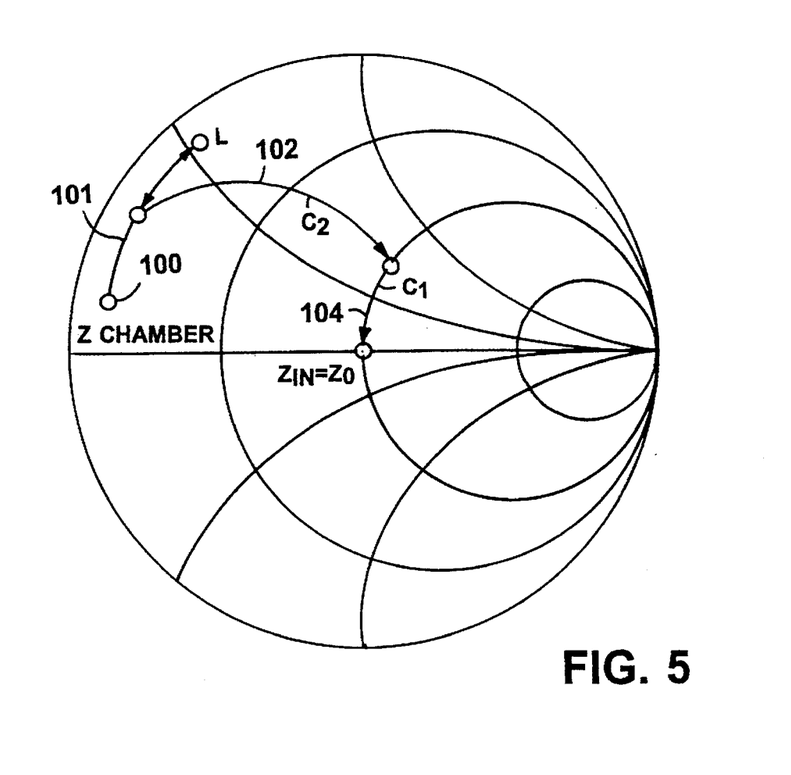
FIG. 5 illustrates on a Smith Chart how the reactive elements transform the chamber impedance, $Z_{CH}$, to produce $Z_{IN}$.

A typical plasma chamber with a plasma in it presents a slightly inductive impedance, as indicated by point 100 in FIG. 5. Note that the center of the Smith Chart represents match condition, i.e., the characteristic impedance of the coaxial line that carries power to the chamber. Because L and C are in series with the load and have no resistive component, they transform the chamber impedance by moving it along a constant resistance curve 101. Inductor L moves it up the curve toward the point labeled L and capacitor C moves it back down that curve to the point labeled C. The amount of movement along these curves, of course, depends on the value of the reactive component that is being added and by the frequency of operation.

$C_2$, which is a shunt element (i.e., it is in parallel with the load), transforms the chamber impedance by moving it along a constant conductance curve 102 in the admittance Smith Chart. In this case, $C_2$ transforms the chamber impedance by moving it toward the center of the Smith Chart, i.e., toward $Z_0$. Finally, $C_1$, which like L and C is a series component, transforms the chamber impedance by moving it back down a constant resistance curve 104.

By the proper selection of the values of L, C, $C_1$, and $C_2$, it is possible to transform the chamber impedance so that it matches the characteristic impedance of the coaxial line, $Z_0$, and thereby achieve a match condition. Detector circuit 32 finds the values of $C_1$ and $C_2$ which achieve the match condition and then controls the values of $C_1$ and $C_2$, by controlling the movement of the capacitor plates, to keep the system operating at $Z_0$ even though the impedance of the plasma may be changing significantly during processing.

Selecting Values for the Phase Shift Elements

Typically, the optimum values of the phase shifts introduced by phase shift elements 71 and 73 can be selected only after the plasma chamber has been fully characterized. This is because the impedance of the plasma chamber is complex function of many variables including the power into the chamber, chamber pressure, the particular process being performed, the particular wafers that are being processed, the details of the metalization pattern on the wafer, and other factors. Over the different operating conditions that one might encounter, $Z_{CH}$ can take on a wide range of different values. The selection of the appropriate phase shifts that need to be introduced by the phase shift elements depend on the variability of $Z_{CH}$.

One objective of the characterizing procedure is to find the phase shifts that are required from phase shift elements 71 and 73 which will produce a detector circuit that works as desired over all chamber impedances that one is likely to encounter in the system during processing. Also, the characterizing procedure is used to find phase shifts which produce a system that works properly over the entire range of values that $C_1$ and $C_2$ can assume—from $C_{1min}$ to $C_{1max}$ and from $C_{2min}$ to $C_{2max}$.

Figure 6:
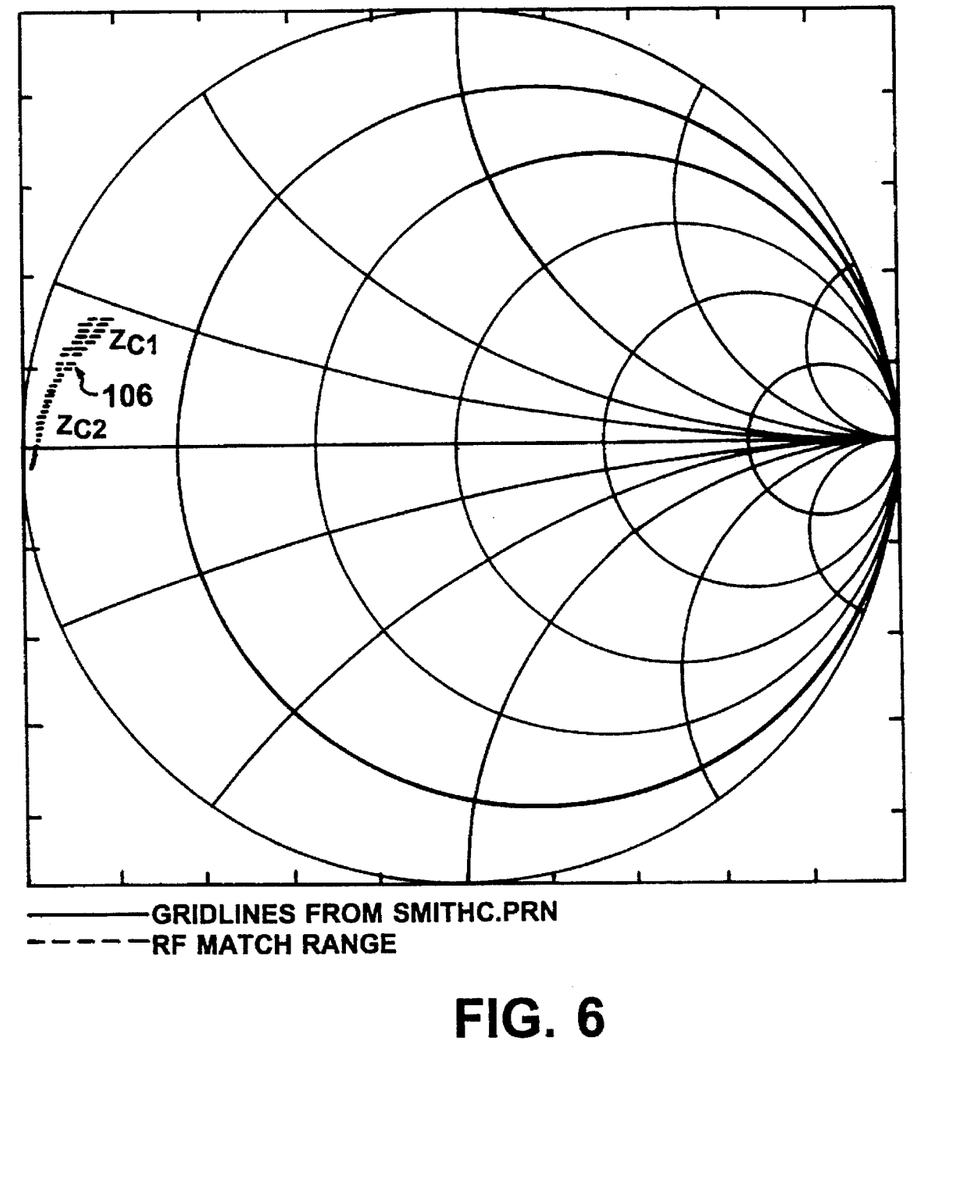
FIG. 6 shows a plot of RF match input reflection coefficient for a range of chamber impedances.

Therefore, as a first step in selecting the appropriate values for the phase shifts, we must determine the full range of chamber impedances that are likely to be encountered during plasma processing in a plasma chamber of a given design. This part of the characterization procedure involves measuring the impedance of the chamber for many different operating conditions, chosen to be representative of the actual operating conditions one might encounter during plasma processing and then calculating how $Z_{IN}$ changes as a function of $C_1$, $C_2$, and A representative plot of $Z_{CH}$ in the Γ-plane of an actual chamber is shown in FIG. 6 (see points labeled 106). In this case, since the different operating points fall within a narrow region, it is possible to characterize the region by its two extremes, namely, $Z_{CH1}$ and $Z_{CH2}$. In an actual system, $Z_{CH1}$ and $Z_{CH2}$ were measured to be equal to 3.69∠71.7 and 7.65∠72.9, respectively.

In characterizing the system, each of the variable reactance elements has three values that are of particular relevance, namely, its minimum value, its maximum value, and its value at the match condition. For $C_1$ these three values are designated $C_{1min}$, $C_{1max}$, and $C_{1match}$. Similarly, for $C_2$ the three values are designated $C_{2min}$, $C_{2max}$, and $C_{2match}$.

The procedure for characterizing the system involves calculating how $Z_{IN}$ changes as a function of the capacitance of one of the capacitors while holding the other capacitor at a constant value. The calculations are performed for at least two chamber impedances (e.g. $Z_{CH1}$ and $Z_{CH2}$) and for three different values of the capacitor that is being held constant (i.e., its minimum value $C_{min}$, its match value $C_{match}$, and its maximum value, $C_{max}$).

More specifically, assume that capacitor $C_1$ is held at a specific fixed value while capacitor $C_2$ is varied. For a selected fixed value of $C_1$ and a set of operating conditions that yields a chamber impedance of $Z_{CH1}$, $C_2$ is swept from its minimum value to its maximum value as $Z_{IN}$ is calculated. This is repeated for each of three values of $C_1$. When these calculations are completed, they are repeated for one or more additional values of $Z_{CH}$. In the described example, where the measured chamber impedances lie relatively close to a single curve, then selecting the chamber impedance at either end of the curve would probably yield a satisfactory characterization of the chamber. On the other hand, it may be desirable to make calculations for more than two representative chamber impedances, particularly, if the range of values which the chamber impedance takes on during processing is not so well behaved.

The above-described the calculations produce a set of three curves for each value of $Z_{CH}$. An example of the curves produced from such calculations is shown in FIG. 7. The curves are labeled $C_{1min}$, $C_{1max}$, and $C_{1match}$, for the three values that $C_1$ assumes. An arrow indicates the direction of movement of $Z_{IN}$ as the value of $C_2$ increases. In this case, the operating conditions were set to achieve a chamber impedance of $Z_{CH1}$.

Figure 8:
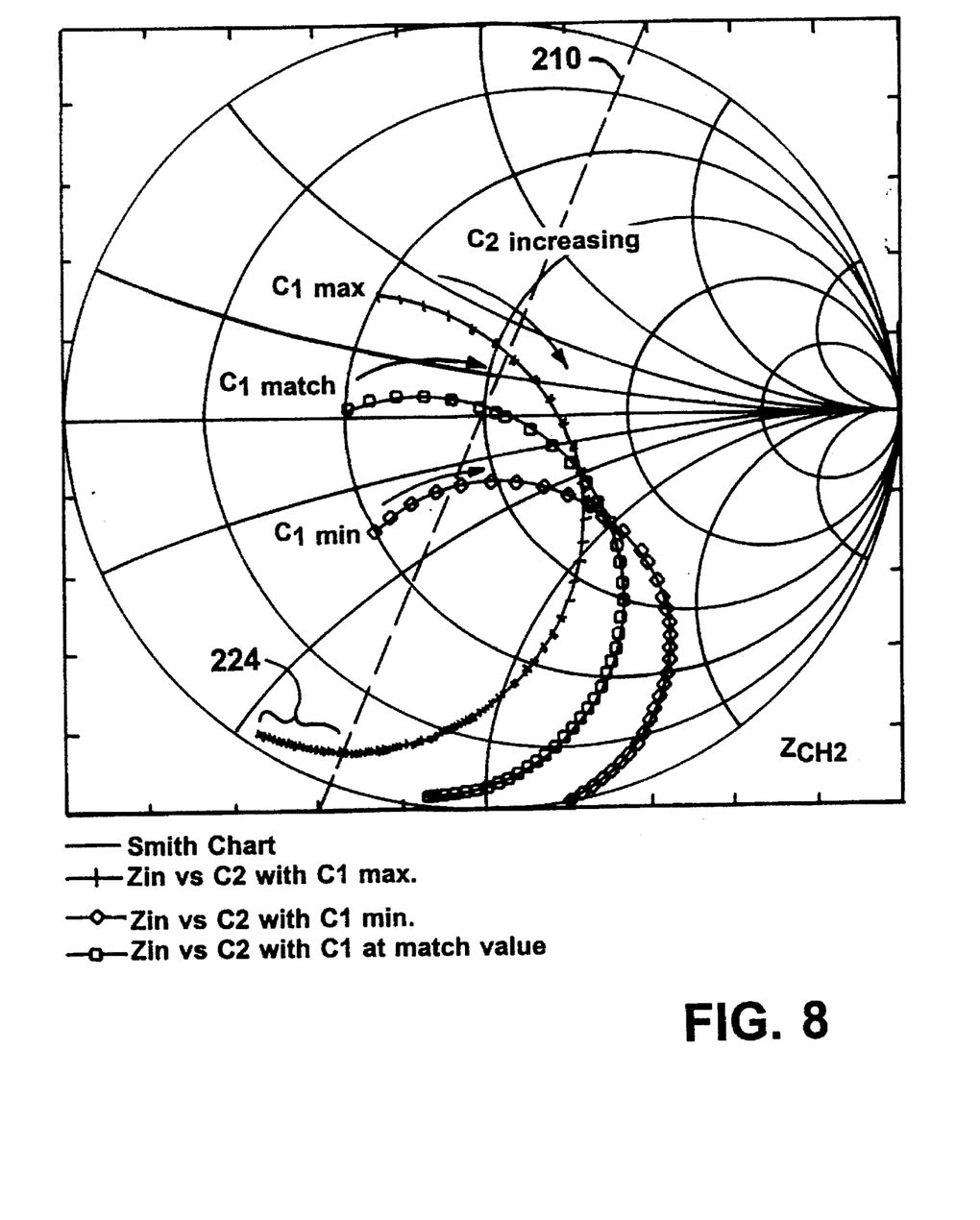
FIG. 8 shows a plot of RF match input reflection coefficients as a function of $C_2$ for a chamber impedance of $Z_{CH2}$ and for three different values of $C_1$, namely, $C_{1min}$, $C_{1match}$, and $C_{1max}$.

The same calculations are performed for operating conditions that produce $Z_{CH2}$ to yield a second set of curves, as illustrated in FIG. 8.

Figure 9:
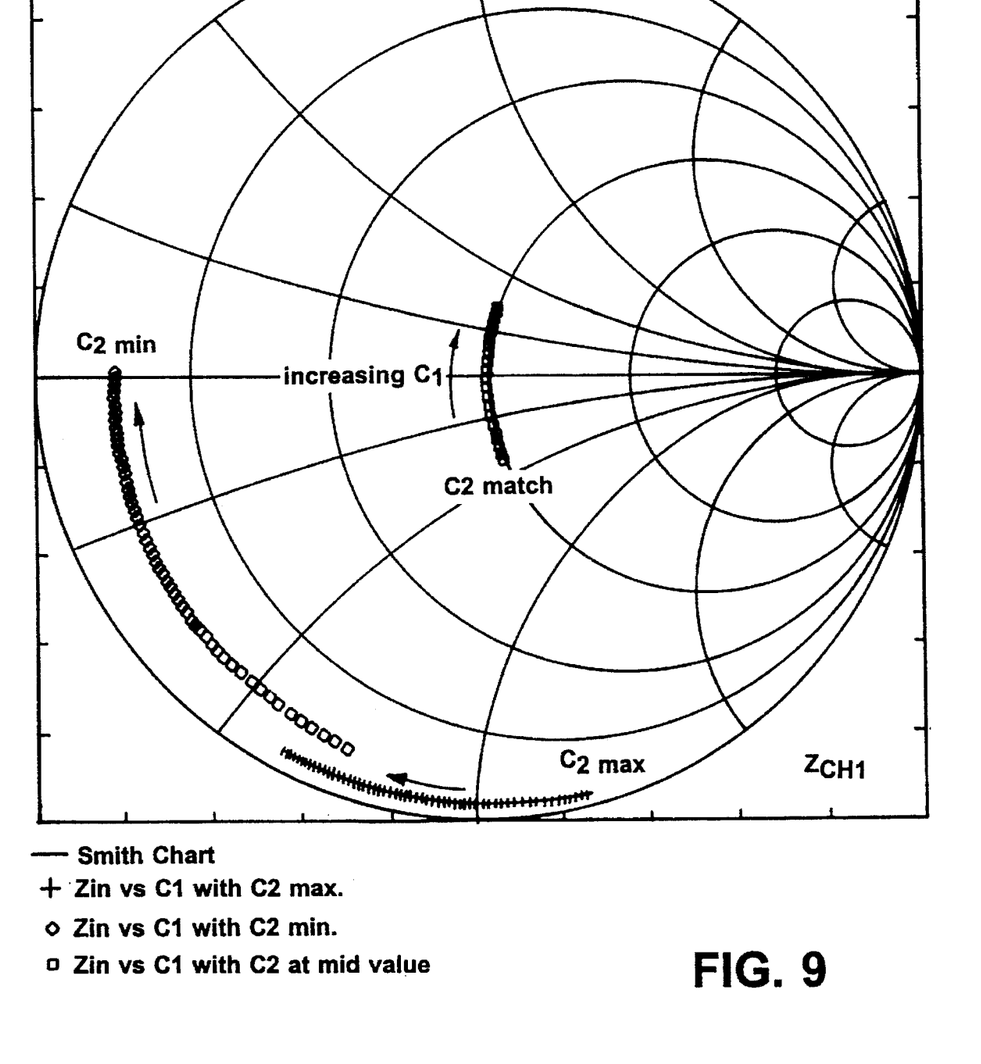
FIG. 9 shows a plot of RF match input reflection coefficients as a function of $C_1$ for a chamber impedance of $Z_{C1}$ and for three different values of $C_2$, namely, $C_{2min}$, $C_{2match}$, and $C_{2max}$.
Figure 10:
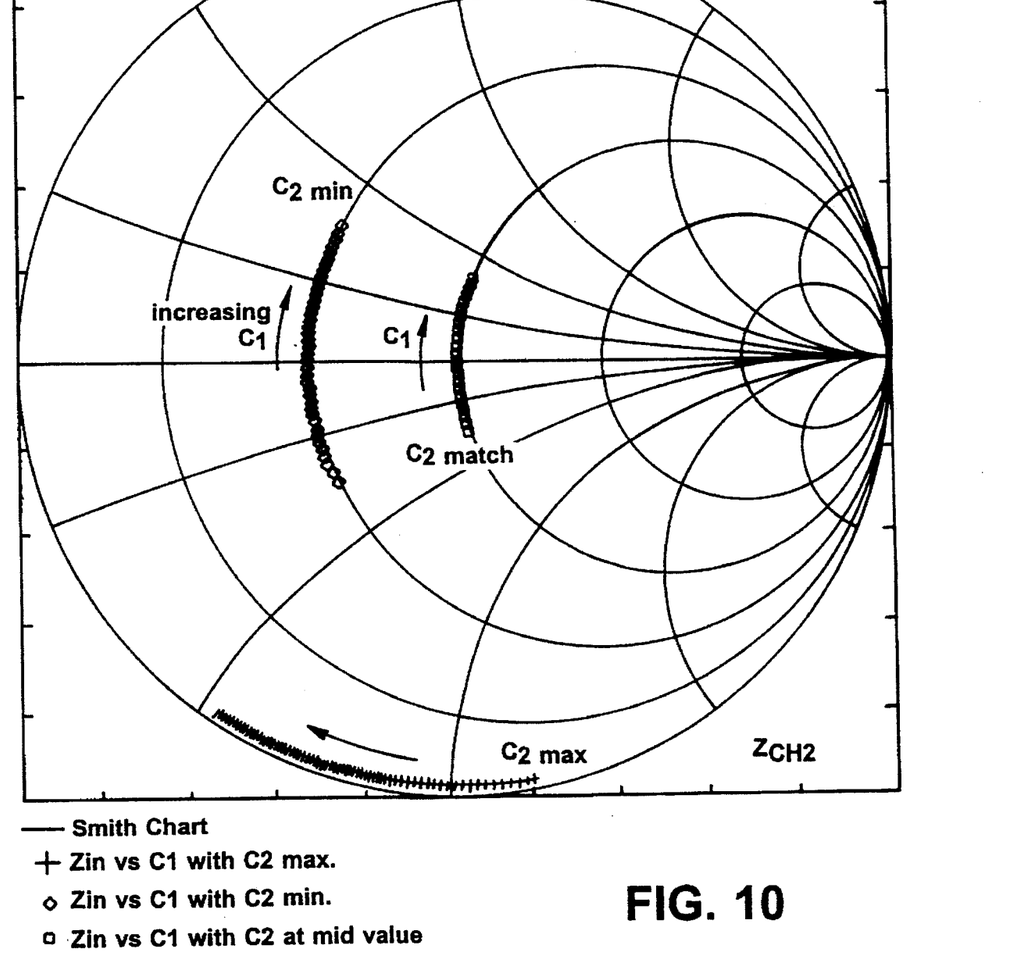
FIG. 10 shows a plot of RF match input reflection coefficients as a function of $C_1$ for a chamber impedance of $Z_{CH2}$ and for three different values of $C_2$, namely, $C_{2min}$, $C_{2match}$, and $C_{2max}$.

Another set of calculations are performed in the same way, but this time holding $C_2$ fixed and sweeping $C_1$ over its full range of values from $C_{1min}$ to $C_{1max}$. These calculations generate curves such as those illustrated in FIGS. 9 and 10. For the calculations shown in FIG. 9, the operating conditions in the chamber were set to produce a chamber impedance of $Z_{CH1}$ and for FIG. 10, the operating conditions were set to produce a chamber impedance of $Z_{CH2}$. The three curves in each figure are labeled to indicate the value of $C_2$ that was used in producing the curve, namely, $C_{2min}$, $C_{2max}$, and $C_{2match}$.

Altogether a complete characterization of the illustrated system consists of twelve curves, six curves for capacitor $C_1$ and six curves for capacitor $C_2$. As might be expected, in all cases (i.e., FIGS. 7–10), the $C_{1match}$ and $C_{2match}$ curves both pass through or very close to the center of the Smith Chart (i.e., $Z_{IN}=Z_0$), where the match condition exists.

After the above-described calculations have been performed on the plasma chamber, the appropriate phase shifts can be determined by identifying a control line that yields the best discrimination with no regions of instability (or if that is not possible, the smallest regions of instability). Stated differently, the object is to select a phase shift that produces a control line which intersects all relevant curves only once.

To illustrate the method for determining the orientation of an optimum control line (and thus the value of the phase shift of the corresponding phase detector), refer to the $C_{1max}$ curve (i.e., curve 198) in FIG. 7. If no phase shift elements are employed for either input of phase detector 64, vertical axis 199 becomes the control line. Note that the vertical axis intersects the $C_{1max}$ curve twice, once at point 200 and a second time at point 202. If the operating point lies on the portion of curve 198 that is to the left of point 200, the output of phase detector 64 will be positive and thus cause motor 44 to move the capacitor plates of capacitor $C_2$ in a direction that increases the value $C_2$. Thus, the operating point will move towards the vertical axis. If the operating point lies on the portion of curve 198 that is between points 200 and 202, then the output of phase detector 68 will be negative and this will cause motor 44 to move the plates of capacitor C2 in a direction that decreases the value of C2. Again the operating point will move towards the vertical axis.

In contrast, if the operating point lies on the portion of curve 198 that is to the left of point 202, the system will not behave as desired. An operating point on this portion of curve 198 will produce an output of phase detector 68 that is positive. This will force C2 to increase in value driving the operating point further away from the vertical axis rather than closer to it. In other words, for operating points in this region, the system will be unstable and will not properly converge on the match point.

From the above, it should now be apparent why the ideal control line is a line which intersects every curve only once. The relevant curves for determining the phase shift for the $C_2$ control circuit (i.e., the portion of the detector circuit including phase detector 64) are the curves shown in FIGS. 7 and 8. And similarly, the relevant curves for determining the phase shift for the $C_1$ control circuit (i.e., the portion of the detector circuit including phase detector 68) are the curves shown in FIGS. 9 and 10.

In the present example, as can be seen from even a superficial examination of the curves in FIGS. 7 and 8, there is no line orientation that satisfies the requirement that it intersect every curve only once. All possible lines intersect at least one of the curves twice. In other words, all orientations of the control line produce some region of instability. Therefore, in this case, the object is to select a control line orientation that minimizes any resulting region of instability.

Control line 210 is an example of one possible choice. It produces small regions of instability at the end of the curve where $C_2$ is at a maximum value (see line portions labeled 220, 222, and 224 in FIGS. 7 and 8). This control line orientation is achieved by using a phase shift element 71 which produces a phase shift of about 330° on the reflected signal side of phase detector 64 (or alternatively a phase shift at 58a of 30°).

A similar approach is used to select the optimum orientation of the control line for $C_1$. In the case of $C_1$, there are many lines which intersect all curves no more than once. Indeed, there are many orientations in which the control line does not even intersect some of the curves once. Thus, there are multiple options for selecting the phase shift. Since $C_2$ is the dominant match element in the illustrated example, it is only important to have the control line for $C_1$ chosen for values of $C_{2match}$. In the described example, the horizontal axis is selected as the control line. This line is generated by using a phase shift element 73 which introduces a phase shift of 90° on the reflected signal side of phase detector 68.

Once such a characterization procedure is completed for a particular system design, it need not be performed again. The computed phase shifts will typically apply for all manufactured systems of that identical design.

Note that we have added the phase shift elements to the reflected signal. Alternatively, they could be added to the forward signal or to both the forward signal and the reflected signal. If the phase shift is added to the reflected signal, it will rotate the control line in a counterclockwise direction about the center of the Smith Chart. Whereas, if it is added to the forward signal, it will rotate the control line in a clockwise direction. Also note that the electrical length between the phase detectors and the RF match section will rotate both control lines by equal amounts in a counterclockwise direction.

We have also used 0° power splitters in the described embodiment. Alternatively, other power splitters could also be used (e.g. 90°, 180°, etc). In that case, the phase shifts will have to be adjusted accordingly to take into account the relative phase shift that is added by the power splitter.

When initializing the system, it is useful to have the system software select a starting point that is close to the match condition. This will minimize the chances of starting at a point which falls within an unstable a region of unstable operation, assuming such a point even exists.

The time for achieving a lock condition will, of course, depend upon how far the system is from the match condition when the detector circuit is allowed to take control. If the system starts from an extreme position, the time will obviously be longer than if it starts closer to match. The rate at which the system will achieve a lock condition, which depends on motor driver gain values and mechanical drag, is typically faster than even the shortest practical process times, which can be as short as 20 seconds. Assuming that the operating point is near the match point when the detector circuit is allowed to take control, the system will typically achieve a lock in less than 0.5–1.0 seconds. Even if the operating point is much farther from the match condition, the system takes less than about 2–3 seconds to reach the lock condition.

Once the detector circuit reaches the match point, it will keep the system at the match point during plasma processing. If the operating point drifts away from the match condition, the resulting output signals will drive the system back toward match condition.

Figure 11:
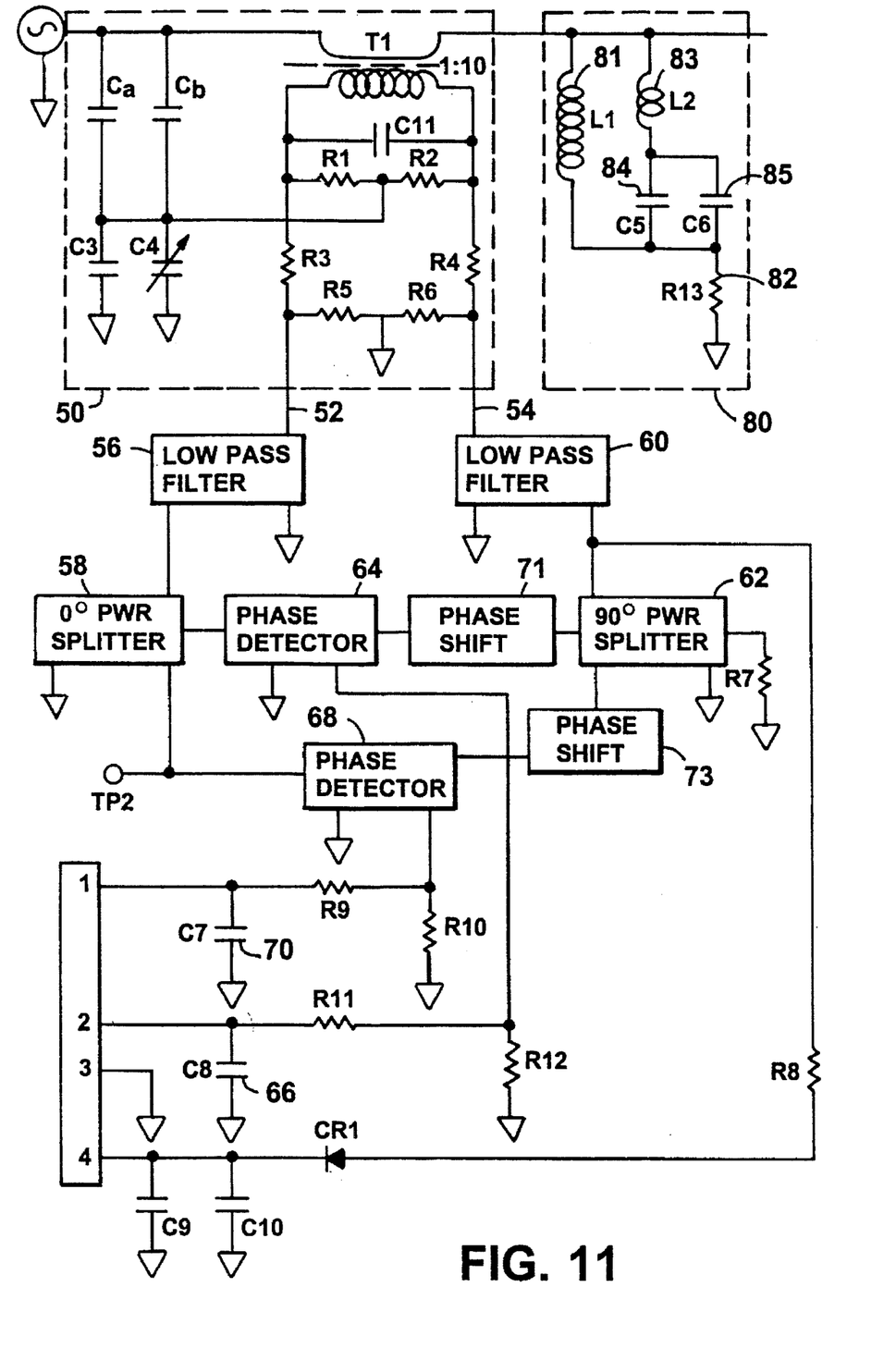
FIG. 11 is a more detailed circuit diagram showing the design of the low pass filters depicted in FIG. 2.

The details of specific implementations of harmonic termination circuit 80 and low pass filters 66 and 70 are shown in FIG. 11. Harmonic termination 80 includes a shunt inductor 81 connected between the cable 15 and ground through a resistor 82, and a second shunt inductor 83 connected between the cable 15 and the resistor 82 through a pair of parallel capacitors 84, 85. For use with an RF source frequency of 60 MHZ, the inductors 81, 83 are of 120 nH and 40 nH, respectively, the parallel capacitors 84, 85 are each 22 pF and the resistor 82 is 10 Ohms.

In FIG. 11, the terminals labeled 1 and 2 on the board 100 are the output control voltages applied through amplifiers to the servo motors 42 and 44 of FIG. 2. Terminal 4 provides a signal that is proportional to the reflected power magnitude and which might be useful to a technician during calibration or trouble-shooting.

The following table lists specific values of the capacitors, inductors, and resistors shown in FIG. 11 for operating at 60 MHZ.

TABLE I

| Capacitors | Capacitors in picoFarads |
| --- | --- |
| Ca | 2.0 |
| Cb | 3.0 |
| C3 | 160 |
| C4 | 2.0–23 (variable) |
| C5 | 22 |
| C6 | 22 |
| C7 | 10,000 |
| C8 | 10,000 |
| C9 | 10,000 |
| C10 | 1,000 |
| C11 | 33 |
| Inductors | Inductance in nanoHenries |
| L1 | 120 |
| L2 | 40 |
| Resistors | Resistance in Ohms |
| R1 | 15 |
| R2 | 15 |
| R3 | 240 |
| R4 | 240 |
| R5 | 56 |
| R6 | 56 |
| R7 | 50 |
| R8 | 1,000 |
| R9 | 20,000 |
| R10 | 1,000 |
| R11 | 20,000 |
| R12 | 1,000 |
| R13 | 10 |

It should be understood that the phase shift elements shown in FIG. 2 represent the relative difference in phase of the signals at the two inputs to each phase detector. There can, in fact, be a phase shift element connected to each input of each phase detector. In that case, it is the difference in the phase shifts introduced by the two phase shift elements that is important. For example, assume that phase shift element 71 on the one input of phase detector 64 introduces a phase shift of 335°. Also assume that there is another phase shift element (not shown) on the other input line of phase detector 64 and that the other phase shift element introduces a phase shift of Φ. This is equivalent to using only a single phase shift element (i.e., phase shift element 71) that introduces a phase shift of (335°−Φ).

More generally, the embodiment of FIG. 2 may be thought of in terms of phase delays being imposed at every input of each of the phase detectors, where the phase shifts that are introduced by the phase shift elements on the forward signal side of the phase detectors are zero degrees.

While the invention has been described with reference to an embodiment in which the two variable reactive components were a series capacitor $C_1$ and shunt capacitor $C_2$ with phase detectors 64, 68, other embodiments may employ different configurations of two (or more) variable reactive components controlled by separate phase detectors, such as a series variable capacitor and series variable inductor, a shunt variable capacitor and a shunt variable inductor or a series variable inductor and a series variable capacitor, and other combinations of the foregoing.

In addition, the variable reactance element could be a component in which the reactance is varied electrically rather than mechanically. For example, it is possible to vary the inductance of an inductor by mechanically repositioning a core within the inductor. It is also possible to vary the inductance of the inductor by applying a DC magnetic field to change the permeability of the core, as described in U.S. Pat. No. 5,392,018, incorporated herein by reference. The above-described invention is meant to cover the use of any of such variable reactance elements, regardless of how its reactance is varied or controlled.

Though in the above-described embodiment the load was a coil antenna on a plasma processing chamber, the load could be any inductive or capacitive antenna or any element through which high frequency power is delivered to a process or target.

In addition, though the harmonic termination was described as being located between the RF match section and the detector circuit, it could be located elsewhere in the path through which power is delivered to the load. In the described embodiment, however, it is desirable to have it located at a fixed distance from the chamber.

Other embodiments are within the following claims.

What is claimed is:

1. A detector circuit for controlling an RF match circuit that receives an RF power signal from an RF source and delivers said RF power signal to a load, said RF match circuit including a first variable reactance element and a second variable reactance element, wherein a variable reactance of said first reactance element is controlled by a first control signal and a variable reactance of said second reactance element is controlled by a second control signal, said detector circuit comprising:

a dual directional coupler having an input for connecting to the RF source and an output for connecting to the RF match circuit, said dual directional coupler generating a forward signal and a reflected signal, said forward signal being proportional to RF power delivered to the match circuit and said reflected signal being proportional to RF power reflected back from the RF match circuit;

a first branch circuit receiving the reflected signal and producing a first and second output signal therefrom;

a second branch circuit receiving the forward signal and producing a first and second output signal therefrom;

a first phase detector receiving the first output signals of the first and second branch circuits and generating a first phase detection output signal from which said first control signal is derived; and a second phase detector receiving the second output signals of the first and second branch circuits and generating a second phase detection output signal from which said second control signal is derived.

2. The detector circuit of claim 1 wherein said first branch circuit comprises a first power splitter receiving a signal derived from the reflected signal and generating first and second output signals therefrom, the first and second output signals of said first branch circuit being derived, respectively, from the first and second output signals of the first power splitter.

3. The detector circuit of claim 2 wherein said second branch circuit comprises a second power splitter receiving a signal derived from the forward signal and generating first and second output signals therefrom, the first and second output signals of said second branch circuit being derived, respectively, from the first and second output signals of the second power splitter.

4. The detector circuit of claim 3 wherein the first output signal of the first branch circuit is a phase shifted version of the second output signal of the first branch circuit.

5. The detector circuit of claim 4 wherein the first output signal of the second branch circuit is a phase shifted version of the second output signal of the second branch circuit.

6. The detector circuit of claim 3 wherein said first branch circuit further comprises a first phase shift element receiving the first output signal of the first power splitter and producing a first phase shifted signal therefrom, said first phase shifted signal being equal to said first output signal of the first power splitter shifted by a first phase shift amount, said first phase shifted signal being said first output signal of the first branch circuit.

7. The detector circuit of claim 6 wherein said second branch circuit further comprises a second phase shift element receiving the first output signal of the second power splitter and producing a second phase shifted signal therefrom, said second phase shifted signal being equal to said first output signal of the second power splitter shifted by a second phase shift amount, said second phase shifted signal being said first output signal of the second branch circuit.

8. The detector circuit of claim 3 wherein said first branch circuit further comprises a first phase shift element receiving the second output signal of the first power splitter and producing a first phase shifted signal therefrom, said first phase shifted signal being equal to said second output signal of the first power splitter shifted by a first phase shift amount, said first phase shifted signal being said second output signal of the first branch circuit.

9. The detector circuit of claim 8 wherein said second branch circuit further comprises a second phase shift element receiving the second output signal of the second power splitter and producing a second phase shifted signal therefrom, said second phase shifted signal being equal to said second output signal of the second power splitter shifted by a second phase shift amount, said second phase shifted signal being said second output signal of the second branch circuit.

10. The detector circuit of claim 2 wherein the first branch circuit comprises a first harmonic low pass filter receiving said reflected signal and producing said signal derived from the reflected signal.

11. The detector circuit of claim 10 wherein the second branch circuit comprises a second harmonic low pass filter receiving said forward signal and producing said signal derived from the forward signal.

12. The detector circuit of claim 1 wherein the RF power signal is characterized by a primary frequency and further comprising a harmonic termination filter connected to the output of the dual directional coupler, wherein the harmonic termination filter terminates harmonics of the primary frequency.

13. The detector circuit of claim 12 wherein said harmonic termination filter is designed to terminate signals at a $2^{nd}$ harmonic of said primary frequency.

14. The detector circuit of claim 13 wherein said harmonic termination filter is designed to terminate signals at $2^{nd}$ and $3^{rd}$ harmonics of said primary frequency.

15. The detector circuit of claim 1 wherein the first phase detector produces a voltage output of zero when the first output signals of the first and second branch circuits are 90° out of phase.

16. The detector circuit of claim 15 wherein the first phase detector produces a voltage output having a first polarity when the first output signal of the first branch circuit is less than 90° out of phase with the first output signal of the second branch circuit and produces a voltage output having a second polarity when the first output signal of the first branch circuit is greater than 90° out of phase with the first output signal of the second branch circuit, wherein said first polarity is opposite said second polarity.

17. The detector circuit of claim 15 wherein the second phase detector produces a voltage output having a first polarity when the second output signal of the first branch circuit is less than 90° out of phase with the second output signal of the second branch circuit and produces a voltage output having a second polarity when the second output signal of the first branch circuit is greater than 90° out of phase with the second output signal of the second branch circuit, wherein said first polarity is opposite said second polarity.

18. The detector circuit of claim 1 further comprising a first low pass filter receiving the first phase detection output signal and producing said first control signal therefrom.

19. The detector circuit of claim 18 further comprising a second low pass filter receiving the second phase detection output signal and producing said second control signal therefrom.

20. A RF matching circuit for matching an RF power source to a load, said RF matching circuit comprising:

an RF match section connected to the load; and a detector circuit connected between said RF source and said RF match section, said RF match section comprising:

a first variable reactance element;

a second variable reactance element;

a first control circuit controlling the reactance of the first variable reactance element in response to a first control signal; and a second control circuit controlling the reactance of the second variable reactance element in response to a second control signal;

said detector circuit comprising:

a dual directional coupler having an input for connecting to the RF source and an output connected to the RF match section, said dual directional coupler generating a forward signal and a reflected signal, said forward signal being proportional to RF power delivered to the RF match section and said reflected signal being proportional to RF power reflected back from the RF match section;

a first branch circuit receiving the reflected signal and producing a first and second output signal therefrom;

a second branch circuit receiving the forward signal and producing a first and second output signal therefrom;

a first phase detector receiving the first output signals of the first and second branch circuits and generating a first phase detection output signal from which said first control signal is derived; and a second phase detector receiving the second output signals of the first and second branch circuits and generating a second phase detection output signal from which said second control signal is derived.

21. The RF matching circuit of claim 20 wherein said first branch circuit comprises a first power splitter receiving a signal derived from the reflected signal and generating first and second output signals therefrom, the first and second output signals of said first branch circuit being derived, respectively, from the first and second output signals of the first power splitter and wherein said second branch circuit comprises a second power splitter receiving a signal derived from the forward signal and generating first and second output signals therefrom, the first and second output signals of said second branch circuit being derived, respectively, from the first and second output signals of the second power splitter.

22. The RF matching circuit of claim 21 wherein the first output signal of the first branch circuit is a phase shifted version of the second output signal of the first branch circuit, and wherein the first output signal of the second branch circuit is a phase shifted version of the second output signal of the second branch circuit.

23. The detector circuit of claim 22 wherein the first branch circuit comprises a first harmonic low pass filter receiving said reflected signal and producing said signal derived from the reflected signal, and wherein the second branch circuit comprises a second harmonic low pass filter receiving said forward signal and producing said signal derived from the forward signal.

24. The detector circuit of claim 22 wherein the RF power source delivers an RF power signal that is characterized by a primary frequency and further comprising a harmonic termination filter connected to the output of the dual directional coupler, wherein the harmonic termination filter terminates harmonics of the primary frequency.

25. The detector circuit of claim 20 wherein said first variable reactance element is a first variable capacitor.

26. The detector circuit of claim 25 wherein said second variable reactance element is a second variable capacitor.

27. The detector circuit of claim 25 wherein said first variable capacitor includes movable plates which control the capacitance thereof and wherein said first control circuit comprises a first motor that in response to said first control signal moves the plates of the first variable capacitor to vary the capacitance of the first variable capacitor.

28. The detector circuit of claim 26 wherein said second variable capacitor includes movable plates which control the capacitance thereof and wherein said second control circuit comprises a second motor that in response to said second control signal moves the plates of the second variable capacitor to vary the capacitance of the second variable capacitor.

29. A plasma processing system comprising:

a plasma chamber;

an RF matching circuit for matching an RF power source to said plasma chamber, said RF matching circuit comprising:

an RF match section connected to the plasma chamber; and a detector circuit connected between said RF power source and said RF match section, said RF match section comprising:

a first variable reactance element;

a second variable reactance element;

a first control circuit controlling the reactance of the first variable reactance element in response to a first control signal; and a second control circuit controlling the reactance of the second variable reactance element in response to a second control signal;

said detector circuit comprising:

a dual directional coupler having an input for connecting to the RF source and an output for connecting to the RF match circuit, said dual directional coupler generating a forward signal and a reflected signal, said forward signal being proportional to RF power delivered to the match circuit and said reflected signal being proportional to RF power reflected back from the RF match circuit;

a first branch circuit receiving the reflected signal and producing a first and second output signal therefrom;

a second branch circuit receiving the forward signal and producing a first and second output signal therefrom;

a first phase detector receiving the first output signals of the first and second branch circuits and generating a first phase detection output signal from which said first control signal is derived; and a second phase detector receiving the second output signals of the first and second branch circuits and generating a second phase detection signal from which said second control signal is derived.

* * * * *